United States Patent
Satoh et al.

(10) Patent No.: US 8,207,545 B2
(45) Date of Patent: Jun. 26, 2012

(54) LIGHT-EMITTING DEVICE AND DISPLAY

(75) Inventors: Eiichi Satoh, Osaka (JP); Shogo Nasu, Hyogo (JP); Reiko Taniguchi, Osaka (JP); Toshiyuki Aoyama, Osaka (JP); Masayuki Ono, Osaka (JP); Kenji Hasegawa, Osaka (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 663 days.

(21) Appl. No.: 12/438,062

(22) PCT Filed: Aug. 15, 2007

(86) PCT No.: PCT/JP2007/065908
§ 371 (c)(1),
(2), (4) Date: Feb. 19, 2009

(87) PCT Pub. No.: WO2008/023620
PCT Pub. Date: Feb. 28, 2008

(65) Prior Publication Data
US 2010/0231487 A1 Sep. 16, 2010

(30) Foreign Application Priority Data

Aug. 22, 2006 (JP) ................................. 2006-224914
Aug. 22, 2006 (JP) ................................. 2006-224916

(51) Int. Cl.
*G09G 3/30* (2006.01)
*H01L 33/26* (2010.01)
(52) U.S. Cl. .................. 257/97; 257/E33.048; 313/506; 313/509

(58) Field of Classification Search .......... 313/500–512, 313/582–587; 257/97, 79, E33.048, E21.002, 257/E29.068
See application file for complete search history.

(56) References Cited

U.S. PATENT DOCUMENTS

| 4,937,150 A * | 6/1990 | Tsukada ........................ 428/690 |
| 2004/0227705 A1 | 11/2004 | Fujimoto et al. |
| 2005/0061363 A1 * | 3/2005 | Ginley et al. .................. 136/252 |

(Continued)

FOREIGN PATENT DOCUMENTS

JP 07-216351 8/1995
(Continued)

OTHER PUBLICATIONS

International Preliminary Report on Patentability and Written Opinion of the International Searching Authority, issued in corresponding International Patent No. PCT/JP2007/065908, dated on Mar. 5, 2009.

*Primary Examiner* — Karabi Guharay
*Assistant Examiner* — Elmito Breval
(74) *Attorney, Agent, or Firm* — McDermott Will & Emery LLP (57) ABSTRACT

This light-emitting device includes a first electrode, a second electrode disposed opposite to the first electrode and a phosphor layer which is sandwiched between the first electrode and the second electrode and constituted by dispersing n-type semiconductor particles in a p-type semiconductor medium. A light-emitting device in another embodiment includes a first electrode, a second electrode disposed opposite to the first electrode and a phosphor layer which is sandwiched between the first electrode and the second electrode wherein a p-type semiconductor is segregated among the n-type semiconductor particles.

1 Claim, 9 Drawing Sheets

U.S. PATENT DOCUMENTS

| | | |
|---|---|---|
| 2006/0043361 A1 | 3/2006 | Lee et al. |
| 2006/0091789 A1 | 5/2006 | Aoyama et al. |
| 2008/0191607 A1 | 8/2008 | Kawai et al. |

FOREIGN PATENT DOCUMENTS

| | | |
|---|---|---|
| JP | 8-306485 | 11/1996 |
| JP | 11-214159 | 8/1999 |
| JP | 2005-116503 | 4/2005 |
| JP | 3741157 | 2/2006 |
| JP | 2006-066395 | 3/2006 |
| JP | 2006-127884 | 5/2006 |
| WO | WO 03/020848 A1 | 3/2003 |
| WO | WO 2006/025259 A1 | 3/2006 |

* cited by examiner

LIGHT-EMITTING DEVICE AND DISPLAY

RELATED APPLICATIONS

This application is the U.S. National Phase under 35 U.S.C. §371 of International Application No. PCT/JP2007/065908, filed on Aug. 15, 2007, which in turn claims the benefit of Japanese Application No. 2006-224914, filed on Aug. 22, 2006 and Japanese Application No. 2006-224916 filed on Aug. 22, 2006, the disclosures of which Applications are incorporated by reference herein.

BACKGROUND OF THE INVENTION

1. Technical Field

The present invention relates to a light-emitting device, and particularly, to an electroluminescence device and to a display using the light-emitting device.

2. Background Art

Recently, attention is focused on an electroluminescence device (hereinafter referred to as an "EL device") as a lightweight and thin plane-emitting element. The EL device is largely classified into an organic EL device which emits light by applying a d.c. voltage to a fluorescent body made of an organic material to recombine electrons with holes and an inorganic EL device which emits light by applying an a.c. voltage to a fluorescent body made of an inorganic material to collide electrons accelerated in an electric field as high as $10^6$ V/cm with an emission center of the inorganic fluorescent body, thereby exciting the electrons to allow the inorganic fluorescent body to emit light in the course of relaxation of the excitation.

Moreover, this inorganic EL device includes a dispersion type EL device in which inorganic fluorescent body particles are dispersed in a binder made of a high-molecular organic material to form a phosphor layer and a thin film type EL device in which an insulation layer is formed on one or both sides of a thin-film phosphor layer about 1 μm in thickness. Among these EL devices, the dispersion type EL device attracts considerable attention from the reason that it is advantaged in low production costs because of small power consumption and easy production. In the meantime, the dispersion type EL devices conventionally used each have a laminate structure and constituted by laminating a substrate, a first electrode, a phosphor layer, an insulation layer and a second electrode in this order from the substrate side. The phosphor layer has a structure in which inorganic fluorescent body particles such as ZnS:Mn are dispersed in an organic binder, and the insulation layer has a structure in which a strong insulation material such as $BaTiO_3$ is dispersed in an organic binder. An a.c. power source is disposed between the first and second electrodes and a voltage is applied across the first and second electrodes from the a.c. power source to allow the dispersion type EL device to emit light.

In the structure of the dispersion type EL device, the phosphor layer is a layer determining the luminosity and efficiency of the dispersion type EL device and particles having a diameter of 15 to 35 μm are used as the inorganic fluorescent body particles of the phosphor layer, as shown in International Patent Publication No. WO03/020848. Also, the color of light emitted from the phosphor layer of this dispersion type EL device is determined by the inorganic fluorescent body particles used in this phosphor layer. When, for example, ZnS:Mn is used as the inorganic fluorescent body particles, the phosphor layer emits orange light. When, for example, ZnS:Cu is used as the inorganic fluorescent body particles, the phosphor layer emits bluish green light. In this manner, an emission color is determined by the inorganic fluorescent body particles to be used. Therefore, in the case of intending to obtain an emission color, for example, a white color, other than the color of the above emitting light, the color of emitting light is converted into another color by, for example, mixing an organic dye in an organic binder to thereby obtain the intended color, as shown in Japanese Patent Laid-open Publication No. H7-216351.

However, the light-emitting material used for the dispersion type EL device has problems concerning low luminosity and short life.

There is an idea of increasing the voltage to be applied to the phosphor layer as the method for increasing luminosity. In this case, such a problem arises that the half-value period of the light output of the light-emitting material is reduced in inverse proportion to the applied voltage. On the other hand, there is an idea of dropping the voltage to be applied to the phosphor layer as the method for increasing the half-value period, that is, for lengthening the life. However, this brings out the problem as to deteriorated luminosity. As mentioned above, there is a contradictory relation between the luminosity and the half-value period: when it is intended to improve one of these characteristics by increasing or decreasing the voltage applied to the phosphor layer, the other is deteriorated. It is therefore necessary to select either one of the luminosity and life (half-value period of the light output). In this specification, the term "half-value period" means the time required until the light output of the light-emitting material is reduced to the half of the original luminosity.

Figure 13:
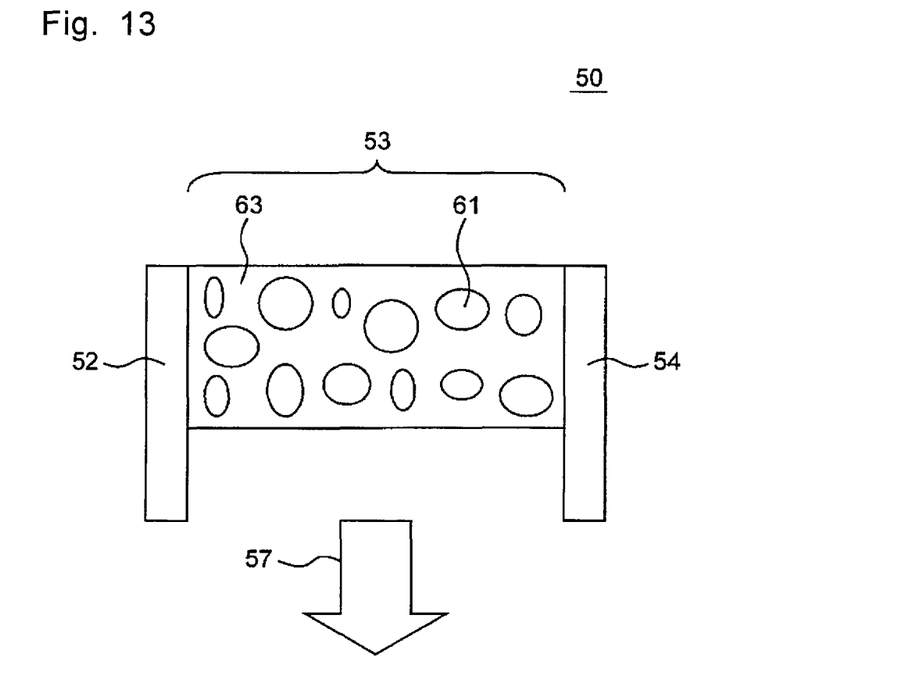
FIG. 13 is a schematic view showing the structure of an inorganic EL device of a conventional example as viewed from a direction perpendicular to the light-emitting plane of the device.

In light of this, there is a proposal on a method in which an EL device is made to emit light at a low voltage, as shown in Japanese Patent No. 3741157. This EL device 50 is based on a method in which, as shown in FIG. 13, a phosphor layer 53 produced by dispersing light-emitting particles 61 of CdSe microcrystals in a medium of indium tin oxide 63 which is a transparent conductor is interposed between electrodes 52 and 54 and a voltage is applied to the phosphor layer 53 to emit light. Because this EL device 50 is a current injection type light-emitting device, it can be driven at a low voltage.

SUMMARY OF THE INVENTION

However, a conductive film is used as the medium in the above method and this method poses a problem that high luminosity is not obtained.

It is an object of the present invention to solve the above problems and to provide a light-emitting device which emits light at a low voltage, and has high luminosity and a long life.

Also, another object of the present invention is to provide a display which solves the above problems, emits light at a low voltage, and has high luminosity and a long life.

The above problems are solved by a light-emitting device according to the present invention. That is, a light-emitting device according to the present invention includes:
a first electrode;
a second electrode disposed opposite to the first electrode; and
a phosphor layer which is sandwiched between the first electrode and the second electrode, wherein the phosphor layer is constituted by dispersing n-type semiconductor particles in a p-type semiconductor medium.

A light-emitting device according to another aspect of the present invention includes:
a first electrode;
a second electrode disposed opposite to the first electrode; and a phosphor layer which is sandwiched between the first electrode and the second electrode, wherein the phosphor layer is constituted of an aggregate of n-type semiconductor particles, wherein a p-type semiconductor is segregated among the n-type semiconductor particles.

Also, the n-type semiconductor particles are preferably connected electrically with the first and second electrodes interposing the p-type semiconductor therebetween.

Moreover, the n-type semiconductor particles and the p-type semiconductor may be respectively a compound semiconductor. Also, the n-type semiconductor particles may be a group 12-16 compound semiconductor. Also, the n-type semiconductor particles may be a group 13-15 compound semiconductor. The n-type semiconductor particles may be a charcopyrite type compound semiconductor. Also, the p-type semiconductor material may be any one of $Cu_2S$, ZnS, ZnSe, ZnSSe, ZnSeTe, ZnTe, GaN and InGaN.

Also, in the case where the n-type semiconductor particles are a zinc type material containing zinc;

at least one of the first and second electrodes is preferably produced of a material containing zinc. In this case, the material which constitutes the one electrode and contains zinc may include zinc oxide as its primary component and at least one type selected from the group consisting of aluminum, gallium, titanium, niobium, tantalum, tungsten, copper, silver and boron.

Moreover, the light-emitting device may be provided with a support substrate facing at least one of the first and second electrodes to support the electrode(s). Also, the light-emitting device may be provided with a color conversion layer opposite to each of the first and second electrodes and located on the front side of the direction of extraction of the light emitted from the phosphor layer.

A display according to the present invention includes:
a substrate;
plural scanning electrodes extending in parallel to each other in a first direction on the substrate;
plural data electrodes extending in parallel to each other in a second direction perpendicular to the first direction; and
at least one phosphor layer interposed between the scanning electrode and the data electrode, wherein;
at least one of the scanning electrode and the data electrode is transparent or semi-transparent and the phosphor layer is constituted by dispersing n-type semiconductor particles in a p-type semiconductor medium.

A display according to another aspect of the present invention includes:
a substrate;
plural scanning electrodes extending in parallel to each other in a first direction on the substrate;
plural data electrodes extending in parallel to each other in a second direction perpendicular to the first direction; and
at least one phosphor layer interposed between the scanning electrode and the data electrode, wherein;
at least one of the scanning electrode and the data electrode is transparent or semi-transparent, the phosphor layer is constituted of an aggregate of n-type semiconductor particles and a p-type semiconductor is segregated among the n-type semiconductor particles.

Also, the n-type semiconductor particles are preferably connected electrically with the first and second electrodes interposing the p-type semiconductor therebetween.

Moreover, the n-type semiconductor particles and the p-type semiconductor may be respectively a compound semiconductor. Also, the n-type semiconductor particles may be a group 12-16 compound semiconductor. The n-type semiconductor particles may be a group 13-15 compound semiconductor. The n-type semiconductor particles may be a charcopyrite type compound semiconductor. Also, the p-type semiconductor material may be any one of $Cu_2S$, ZnS, ZnSe, ZnSSe, ZnSeTe, ZnTe, GaN and InGaN.

Also, in the case where the n-type semiconductor particles are a zinc type material containing zinc, at least one of the first and second electrodes is preferably produced of a material containing zinc. In this case, the material which constitutes the one electrode and contains zinc preferably includes zinc oxide as its primary component and at least one type selected from the group consisting of aluminum, gallium, titanium, niobium, tantalum, tungsten, copper, silver and boron.

Moreover, the light-emitting device may be further provided with a support substrate facing at least one of the first and second electrodes to support the electrode(s).

Also, the light-emitting device may be further provided with a color conversion layer opposite to each of the first and second electrodes and located on the front side of the direction of extraction of the light emitted from the phosphor layer.

In the light-emitting device and the display according to the present invention, the phosphor layer has any one of (i) a structure in which n-type semiconductor particles are dispersed in a p-type semiconductor medium or (ii) a structure which is an aggregate of n-type semiconductor particles wherein a p-type semiconductor is segregated among these n-type semiconductor particles. Since the phosphor layer has the above structure, not only electrons but also holes can be efficiently injected into the inside or boundaries of n-type semiconductor particles to thereby attain a light-emitting device and a display which emit light with high luminosity at a low voltage and have a long life.

BRIEF DESCRIPTION OF THE DRAWINGS

The present invention will become readily understood from the following description of preferred embodiments thereof made with reference to the accompanying drawings, in which like parts are designated by like reference numeral and in which:

FIG. 4A and FIG. 4B are views for illustrating a comparative example, wherein

DETAILED DESCRIPTION OF THE PREFERRED EMBODIMENTS

A light-emitting device according to embodiments of the present invention will be explained with reference to the appended drawings. In these drawings, substantially the same members are designated by the same symbol.

First Embodiment

Schematic Structure of EL device

Figure 1:
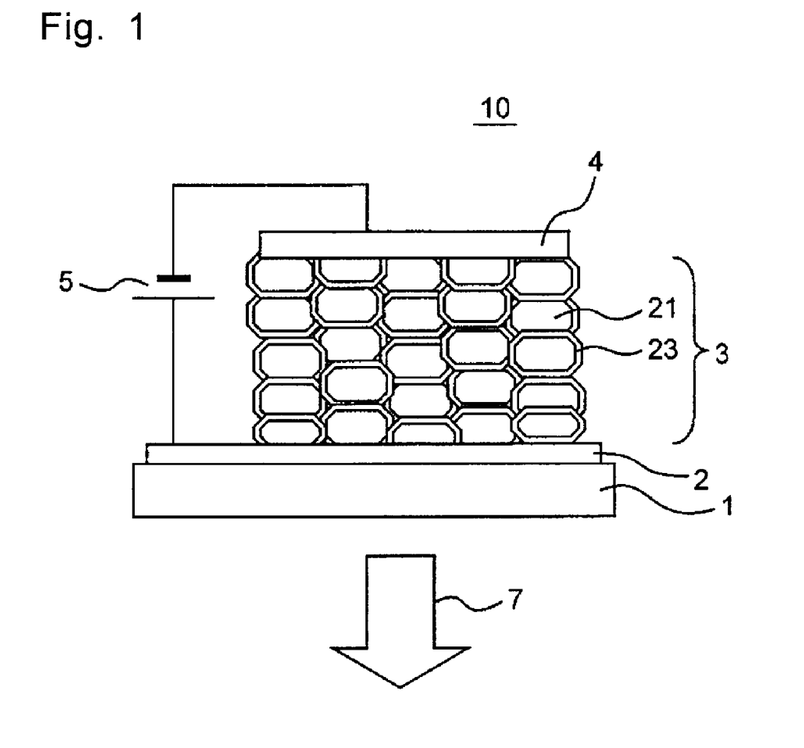
FIG. 1 is a schematic structural view of a light-emitting device according to a first embodiment of the present invention as viewed from a direction perpendicular to the light-emitting plane of the device.

FIG. 1 is a schematic structural view of a light-emitting device 10 according to the first embodiment of the present invention as viewed from a direction perpendicular to the light-emitting plane of the device. This light-emitting device 10 is provided with a substrate 1, a transparent electrode 2 formed on the substrate 1, a phosphor layer 3 formed on the transparent electrode 2 and a backside electrode 4 formed on the phosphor layer 3. This phosphor layer 3 is sandwiched between the transparent electrode 2 and the backside electrode 4. Also, the substrate 1 is disposed adjacent to the transparent electrode 2 as a support for the whole structure of the light-emitting device 10. Since light is extracted from the substrate 1 side, in this case, a transparent material is used as the substrate 1. Moreover, the transparent electrode 2 is electrically connected to the backside electrode 4 interposing a power source 5 therebetween. When power is supplied from the power source 5, a potential difference is produced between the transparent electrode 2 and the backside electrode 4 to apply a voltage in this light-emitting device 10. Then, the phosphor layer of the phosphor layer 3 disposed between the transparent electrode 2 and the backside electrode 4 emits light which is to be extracted out of the light-emitting device 10 after transmitting the transparent electrode 2 and the substrate 1. In this embodiment, a d.c. power source is used as the power source 5.

Figure 5:
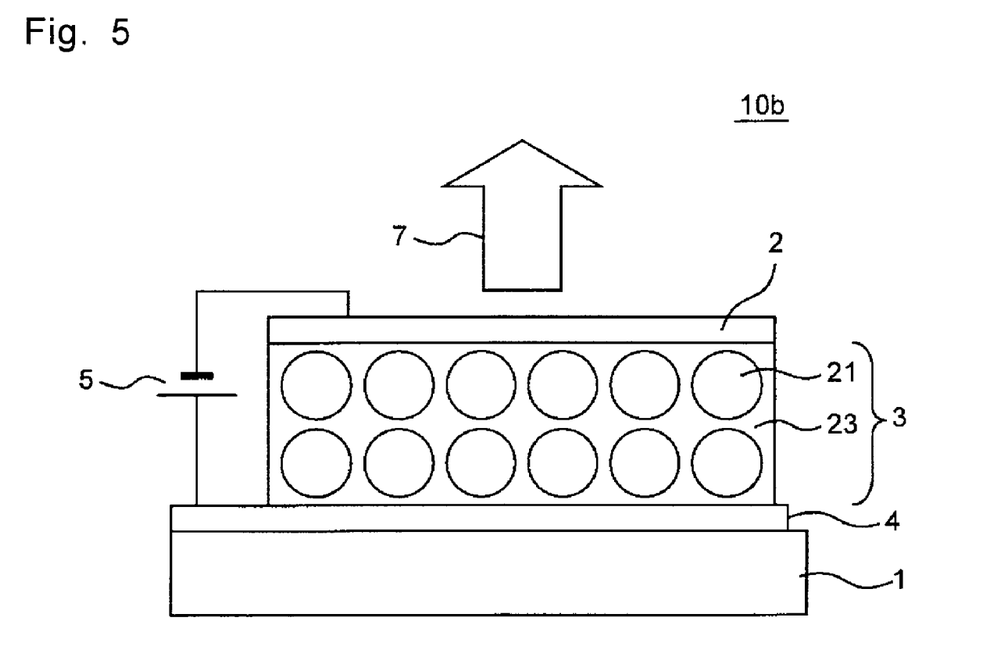
FIG. 5 is a schematic structural view of a light-emitting device of a further example according to the first embodiment of the present invention as viewed from a direction perpendicular to the light-emitting plane of the device.

This light-emitting device 10 is characterized by the phosphor layer 3 which is constituted of an aggregate of n-type semiconductor particles 21, wherein a p-type semiconductor 23 is segregated among these particles. Alternatively, a light-emitting device 10b of another embodiment shown in FIG. 5 is characterized by the phosphor layer 3 which is constituted by dispersing the n-type semiconductor particles 21 in a medium of the p-type semiconductor 23. When the boundaries between the n-type semiconductor particles and the p-type semiconductor are formed in a large number in this manner, the ability to inject holes is improved and therefore, the light emission based on the recombination of electrons and holes is produced efficiently, making possible to obtain a light-emitting device which emits light with high luminosity at a low voltage. Moreover, the structure in which n-type semiconductor particles are electrically connected to the electrodes interposing a p-type semiconductor therebetween can improve the luminous efficiency of the device.

The structure of the light-emitting device 10 is not limited to the above one and may be freely modified into various structures: for example, a structure in which plural phosphor layers 3 are formed, a structure in which plural thin dielectric layers are formed between the electrodes 2 and 4 and the phosphor layer 3 for the purpose of limiting the current, a structure in which the transparent electrode 2 and the backside electrode 4 are replaced with each other, a structure in which both the transparent electrode 2 and the backside electrode 4 are made to be transparent to the emitted light, a structure in which an a.c. power source is used as the power source 5, a structure in which the backside electrode 4 is changed to a black electrode, a structure further provided with a structure for sealing all or a part of the light-emitting device 10 or a structure further provided with a structure such as a color conversion layer that converts the light emitted from the phosphor layer 3 on the front side of the direction of extraction of the light.

In the following, each structural member of the light-emitting device 10 will be explained in detail.

<Substrate>

As the substrate 1, a substrate material capable of supporting each layer to be formed thereon is used. Also, the substrate material is required to have light transmittance for the wavelength of light emitted from the light-emitting body when the light is extracted from the substrate 1 side. As such a material, for example, glass such as Corning 1737, quartz or ceramic may be used. Non-alkali glass or soda lime glass obtained by coating the surface of glass with alumina or the like as an ion barrier layer may be used to prevent the light-emitting device from being adversely affected by alkali ions or the like contained in usual glass. Also, combinations of polyester, polyethylene terephthalate type or polychlorotrifluoroethylene type and nylon 6, a fluororesin type material, or a film of a resin such as polyethylene, polypropylene, polyimide or polyamide may be used. When a resin film is used, it is preferable to use a material having high durability, flexibility, transparency, electric insulation and moisture proof ability. The above materials are described as examples and the material of the substrate 1 is not particularly limited to these examples.

In the case where light is not extracted from the substrate 1 side, the above light transmittance is not required and a material having no light transmittance may also be used. Examples of such a material include a metal substrate having an insulation layer formed thereon, a ceramic substrate and a silicon wafer.

<Electrode>

There are the transparent electrode 2 on the side from which light is extracted and the backside electrode 4 on the other side as the electrodes. Although the case where the transparent electrode 2 is formed on the substrate 1 as shown in FIG. 1 will be explained here, the present invention is not limited to this case and the device of the present invention may have a structure in which, as shown by a light-emitting device 10a of another example in FIG. 2, the backside electrode 4 is formed on the substrate 1 and the phosphor layer 3 and the transparent electrode 2 are laminated in this order on the backside electrode 4. Alternatively, the transparent electrode 2 and the backside electrode 4 may be both transparent electrodes.

First, the transparent electrode 2 will be explained. Any material may be used as the material of the transparent electrode 2 insofar as it has light transmittance enough to extract emitted light 7 produced in the phosphor layer 3 out of the device and particularly, a material having high transmittance in the visible region is preferable. Also, the material of the transparent electrode 2 preferably has a low resistance and moreover preferably has high adhesion to the substrate 1 and the phosphor layer 3. Particularly preferable examples of the material of the transparent electrode 2 include, though not particularly limited to, metal oxides primarily containing ITO (obtained by doping $In_2O_3$ with $SnO_2$, also refereed to as indium tin oxide), InZnO, ZnO or $SnO_2$, thin films of metals such as Pt, Au, Pd, Ag, Ni, Cu, Al, Ru, Rh and Ir, and conductive polymers such as polyaniline, polypyrrole, PEDOT/PSS and polythiophene. The transparent electrode 2 may be formed by film-formation methods such as the sputtering method, the electron beam vapor deposition method or the ion beam plating method for the purpose of increasing the transparency or decreasing the resistance. Also, after the film is formed, surface treatment such as the plasma treatment may be carried out with the intention of controlling the resistance. The film thickness of the transparent electrode 2 is determined from the seat resistance and visible light transmittance to be required.

The carrier density of the transparent electrode 2 is preferably in a range of from 1E17 to 1E22 $cm^{-3}$. Also, the transparent electrode 2 preferably has a volume resistance of 1E-3Ω·cm or less and a transmittance of 75% or more at a wavelength of 380 to 780 nm to exhibit the performance of the transparent electrode 2. Also, the refractive index of the transparent electrode 2 is preferably 1.85 to 1.95. Also, a dense film having stable characteristics can be attained when the transparent electrode 2 has a film thickness of 30 nm or less.

Also, any material may be used as the backside electrode 4 insofar as it is a generally well-known conductive material. Moreover, this material preferably has high adhesion to the phosphor layer 3. As to preferable examples of the backside electrode 4, metal oxides such as ITO, InZnO, ZnO and $SnO_2$, metals such as Pt, Au, Pd, Ag, Ni, Cu, Al, Ru, Rh, Ir, Cr, Mo, W, Ta and Nb, laminate structures constituted of these materials, conductive polymers such as polyaniline, polypyrrole, PEDOT [poly(3,4-ethylenedioxythiophene)]/PSS(polystyrene sulfonate) and conductive carbon may be used.

Also, the transparent electrode 2 and the backside electrode 4 may be each constituted in such a manner as to cover the entire surface of the layer or may be each constituted by forming plural stripe-like electrodes in the layer. Moreover, the transparent electrode 2 and the backside electrode 4 may each have a structure in which plural stripe-like electrodes are formed, wherein each stripe-like electrode of the transparent electrode 2 is in torsional relation with all stripe-like electrodes of the backside electrode 4 and also, the spot obtained by projecting light on the light-emitting plane from each stripe-like electrode of the transparent electrode 2 is superposed on the spot obtained by projecting light on the light-emitting plane from all stripe-like electrodes of the backside electrode 4. In this case, a display in which specified positions emit light can be structured by applying a voltage across a pair of electrodes selected from stripe-like electrodes of the transparent electrode 2 and stripe-like electrodes of the backside electrode 4.

<Phosphor Layer>

This phosphor layer 3 is sandwiched between the transparent electrode 2 and the backside electrode 4 and has either one of the following two structures.

(i) A structure constituted of an aggregate of n-type semiconductor particles, wherein a p-type semiconductor 23 is segregated among these particles (FIG. 1). In this case, the aggregate of the n-type semiconductor particles 21 itself constitutes a layer.

(ii) A structure in which the n-type semiconductor particles 21 are dispersed in a medium of the p-type semiconductor 23 (FIG. 5).

Moreover, each of the n-type semiconductor particles 21 constituting the phosphor layer 3 is preferably connected electrically to the electrodes 2 and 4 interposing the p-type semiconductor 23 therebetween.

<Phosphor Material>

The n-type semiconductor particles 21 are a n-type semiconductor material which exhibits n-type conductance and in which the majority carriers are electrons. The material may be a group 12-16 compound semiconductor. The material may also be a group 13-15 compound semiconductor. Specifically, materials with an optical bandgap having the size of the visible light, for example, ZnS, ZnSe, GaN, InGaN, AlN, GaAlN, GaP, CdSe, CdTe, SrS or CaS are used as the host materials. Each of these materials is used as it stands or by adding one or more types of elements selected from Ag, Al, Ga, In, Cu, Mn and Cl upon use.

On the other hand, the p-type semiconductor 23 is a p-type semiconductor material which exhibits p-type conductance and in which the majority carriers are holes. As this p-type semiconductor material, compounds such as $Cu_2S$, ZnS, ZnSe, ZnSSe, ZnSeTe and ZnTe and nitrides such as GaN and InGaN are given as examples. $Cu_2S$ and the like among these p-type semiconductor materials intrinsically exhibit p-type conductance. However, other materials are used by adding one or more elements selected from nitrogen, Ag, Cu and In as an additive. Also, a charcopyrite type compound such as $CuGaS_2$ and $CuAlS_2$ exhibiting p-type conductance may also be used.

The light-emitting device 10 according to this embodiment is characterized by the feature that the phosphor layer 3 has any one of (i) a structure in which the p-type semiconductor 23 is segregated among the n-type semiconductor particles 21 (FIG. 1) and (ii) a structure in which the n-type semiconductor particles 21 are dispersed in a medium of the p-type semiconductor 23 (FIG. 5). When the medium to be electrically connected to semiconductor particles 61 is an indium tin oxide 63 as shown by the conventional example in FIG. 13, electrons can reach the semiconductor particles 61 to emit light. However, the hole concentration of the indium tin oxide is small and therefore, holes required for recombination are deficient. Therefore, the emission of highly bright light resulting from the recombination of electrons and holes cannot be expected. In light of this, the inventors of the present invention focused their attentions on a structure in which not only the injection of electrons but also the injection of holes can be attained efficiently in the phosphor layer 3 to obtain continuous emission of light, particularly, having high luminosity with high efficiency. In order to attain the above structure, it is necessary that many holes arrive at the insides or boundaries of light-emitting material particles, and holes be rapidly injected from the electrode opposing to the electron injection electrode and arrive at the light-emitting material particles or the boundaries. In view of this, the inventors of the present invention have made earnest studies and, as a result, found that not only electrons but also holes can be efficiently injected into the insides or boundaries of n-type semiconductor particles by adopting either of the above structures (i) and (ii) as the structure of the phosphor layer 3. Specifically, according to the phosphor layer 3 having each of the above structures, electrons injected from the electrode arrive at the n-type semiconductor particles 21 through the p-type semiconductor 23, while many holes arrive at the light-emitting particles from the other electrode, enabling electrons and holes to be recombined to emit light efficiently. A light-emitting device which emits light with high luminosity at low voltages can be attained, to complete the present invention. Introduction of a donor or an acceptor likewise enables the recombination of free electrons and holes trapped by the acceptor, the recombination of free holes and electrons trapped by the donor and the light emission of a pair of the donor and acceptor. Also, the existence of other ion species in the vicinity of the semiconductors likewise enables light to be emitted by the transfer of energy.

Moreover, when a zinc type material such as ZnS is used as the n-type semiconductor particles 21 of the phosphor layer 3, an electrode made of a metal oxide containing zinc such as ZnO, AZO (obtained by doping zinc oxide with, for example, aluminum) and GZO (obtained by doping zinc oxide with, for example, gallium) is preferably used for at least one of the transparent electrode 2 and the backside electrode 4. The inventors of the present invention have found that the device can be made to emit light with high efficiency by adopting a combination of specified n-type semiconductor particles 21 and specified transparent electrode 2 (or backside electrode 4).

Specifically, when focusing on the work function of the transparent electrode 2 (or the backside electrode 4), the work function of ZnO is 5.8 eV whereas the work function of ITO (indium tin oxide) which has been used as the transparent electrode so far is 7.0 eV. On the other hand, the work function of the zinc type material used as the n-type semiconductor particles 21 of the phosphor layer 3 is 5 to 6 eV. Therefore, the work function of ZnO is closer to that of the zinc type material than that of ITO and therefore, ZnO has such a merit that the ability to injecting electrons into the phosphor layer 3 is improved. This is also the case when AZO or GZO which is a zinc type material is used as the transparent electrode 2 (or the backside electrode 4).

Figure 3A:
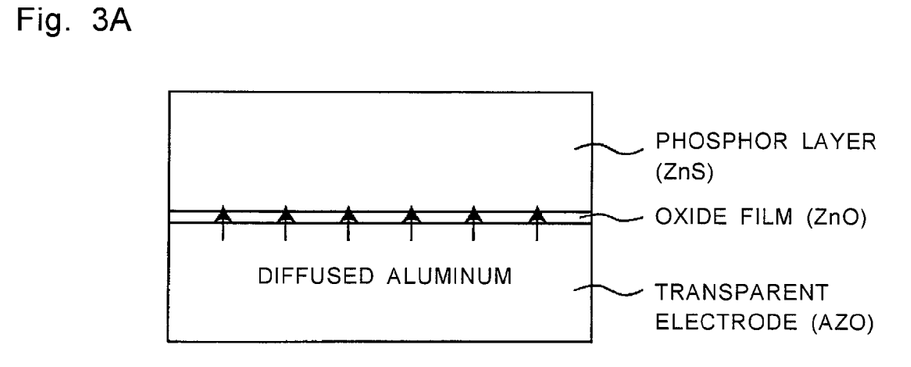
FIG. 3A is a typical view of the vicinity of the boundary between a phosphor layer constituted of ZnS and a transparent electrode (or a backside electrode) constituted of AZO and FIG. 3B is a typical view for illustrating the displacement of the potential energy shown in FIG. 3A.
Figure 3B:
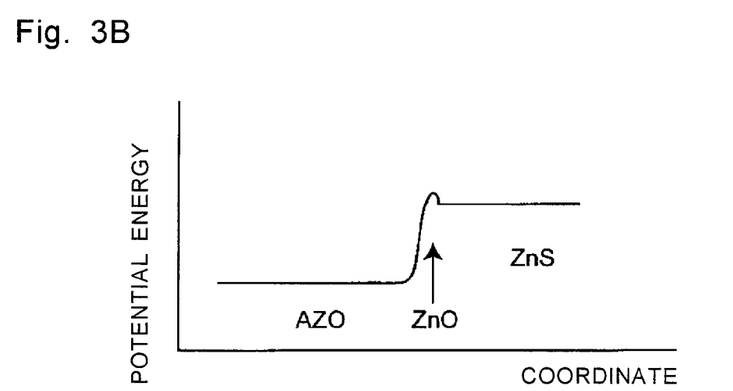

FIG. 3A is a typical view of the vicinity of the boundary between the phosphor layer 3 constituted of ZnS and the transparent electrode 2 (or the backside electrode 4) constituted of AZO. FIG. 3B is a typical view for illustrating the displacement of the potential energy shown in FIG. 3A. Also, FIG. 4A and FIG. 4B are views for illustrating a comparative example, wherein FIG. 4A is a typical view of the boundary between a phosphor layer 3 constituted of ZnS and a transparent electrode constituted of ITO and FIG. 4B is a typical view for illustrating the displacement of the potential energy shown in FIG. 4A.

In the above preferable example as shown in FIG. 3A, the n-type semiconductor particles 21 constituting the phosphor layer 3 are a zinc type material (ZnS) and the transparent electrode 2 (or the backside electrode 4) is a zinc oxide type material (AZO). Therefore, an oxide produced at the boundary between the transparent electrode 2 (or the backside electrode 4) and the phosphor layer 3 is zinc oxide (ZnO). Moreover, a doped material (Al) is diffused at the boundary when the film is formed and an oxide film having a low resistance is thereby formed. Also, the above zinc oxide type (AZO) transparent electrode 2 (or the backside electrode 4) takes a hexagonal system crystal structure. However, the zinc type material (ZnS) which is the n-type semiconductor material 21 constituting the phosphor layer 3 also takes a hexagonal system or cubic system crystal structure and therefore, the strain and also energy barrier are reduced at the boundary of the both. Accordingly, the displacement of potential energy is reduced as shown in FIG. 3B.

Figure 4A:
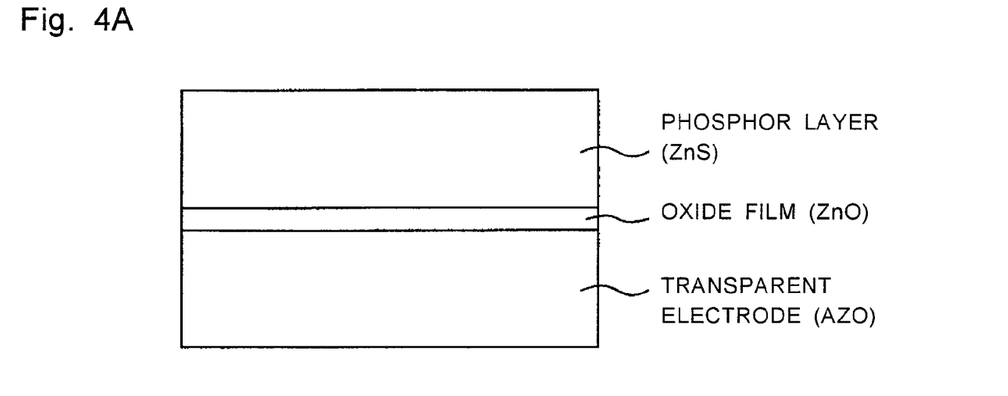
FIG. 4A is a typical view of the boundary between a phosphor layer constituted of ZnS and a transparent electrode constituted of ITO and FIG. 4B is a typical view for illustrating the displacement of the potential energy shown in FIG. 4A.
Figure 4B:
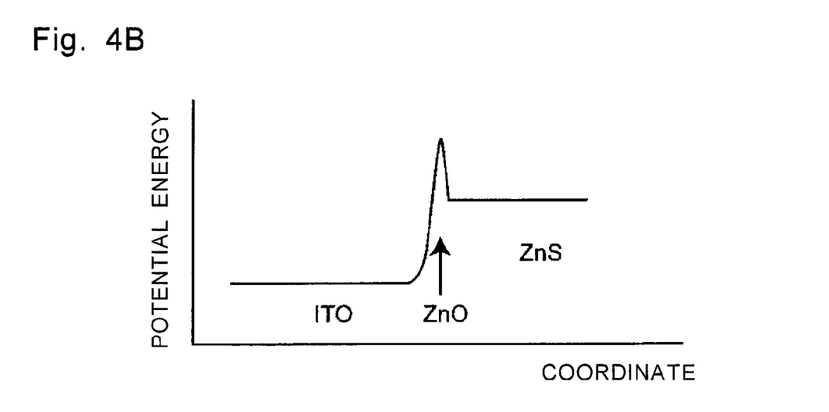

In a comparative example, on the other hand, the transparent electrode is ITO which is not a zinc type material as shown in FIG. 4A and therefore, an oxide film (ZnO) produced at the boundary has a crystal structure different from that of ITO. The energy barrier at the boundary is therefore increased. Therefore, as shown in FIG. 4B, the displacement of potential energy is increased at the boundary, leading to a reduction in the luminous efficiency of the light-emitting device.

When a zinc type material such as ZnS or ZnSe is used as the n-type semiconductor particles 21 of the phosphor layer 3 as mentioned above, it is combined with the transparent electrode 2 (or the backside electrode 4) made of a zinc oxide type material, whereby a light-emitting device improved in luminous efficiency can be provided.

In the above example, the explanations are furnished taking AZO doped with aluminum and GZO doped with gallium as examples of the transparent electrode 2 (or the backside electrode 4) containing zinc. The same result is obtained in the case of using zinc oxide doped with at least one type among aluminum, gallium, titanium, niobium, tantalum, tungsten, copper, silver and boron.

Next, a method of forming the phosphor layer 3 of the light-emitting element according to the first embodiment of the present invention will be explained.

(a) In the case of a thin-film type phosphor layer, a vacuum film formation process such as the sputtering method, the electron beam (EB) vapor deposition method, the resistance heating vapor deposition method or the CVD method is used and heat treatment is carried out under a specified atmosphere as necessary, thereby making it possible to obtain the phosphor layer 3 (the above structure (i)) having a structure in which a p-type semiconductor is segregated among n-type semiconductor particles.

(b) Also, in the case of a phosphor layer 23, a p-type semiconductor material is melted under vacuum or inert gas in advance and n-type semiconductor particles having a higher melting point than the melted p-type semiconductor are dispersed in the p-type semiconductor, followed by cooling, thereby making it possible to obtain the phosphor layer 3 (the above structure (ii)) in which the n-type semiconductor particles 21 are dispersed in the medium of the p-type semiconductor 23.

(c) Also, a p-type semiconductor material and a n-type semiconductor material are mixed in advance and the mixture is melted under vacuum, followed by cooling, to precipitate the n-type semiconductor crystal particles 21 in a medium of the p-type semiconductor 23, thereby making it possible to obtain the phosphor layer 3 (the structure of another example of the above (ii)) in which the n-type semiconductor particles 21 are precipitated in the medium of the p-type semiconductor 23.

(d) Moreover, n-type semiconductor particles 24 are dispersed in a medium of the p-type semiconductor 23 according to the above (b) or after the n-type semiconductor particles are precipitated in a medium of the p-type semiconductor 23 according to the above (c), the precipitate is crushed, to obtain a composite particle powder in which the n-type semiconductor is dispersed or precipitated in the p-type semiconductor medium. Then, the composite particle powder is dispersed in an arbitrary organic solvent or the like and then, the solution is applied by the ink jet method, the dipping method, the spin coating method, the screen printing method, the bar coating method or other known solvent casting methods to form a film, the organic solvent is vaporized, thereby making it possible to obtain the phosphor layer 3 (the above structure (i)) which is constituted of an aggregate of the n-type semiconductor particles among which the p-type semiconductor is segregated.

Example 1

Figure 2:
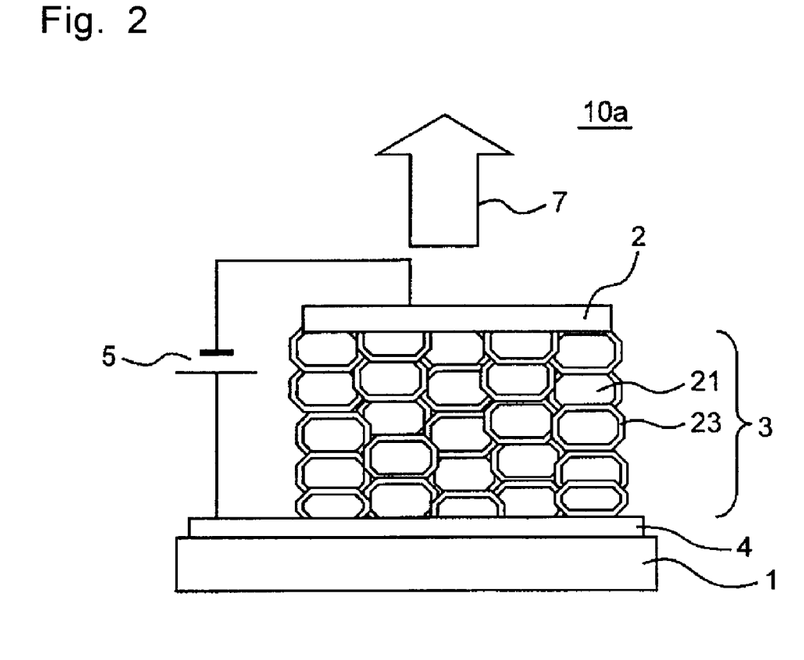
FIG. 2 is a schematic structural view of a light-emitting device of another example according to the first embodiment of the present invention as viewed from a direction perpendicular to the light-emitting plane of the device.

A method of producing a light-emitting device 10a of another example as shown in FIG. 2 will be explained as an embodiment of the present invention. In the light-emitting device 10a of this example, a backside electrode 4 is formed on a substrate 1 and a phosphor layer 3 and a transparent electrode 2 are laminated in this order on the backside electrode 4. Also, this phosphor layer 3 has a structure which is constituted of an aggregate of n-type semiconductor particles among which a p-type semiconductor is segregated (the above structure (i)). In this Example 1, the phosphor layer 3 was formed by the EB vapor deposition method.

(1) A substrate 1 (4) produced by forming a Pt film on a silicon substrate was prepared. In this case, the silicone substrate corresponds to the substrate 1 and the Pt film corresponds to the backside electrode 4.

(2) Next, the phosphor layer 3 was formed using the EB vapor deposition method on the Pt film 4 of the silicon substrate 1 by a process including the following two stages.

a) As the EB vapor deposition apparatus, an EB vapor deposition machine having a ternary vaporizing source was used. Powders of ZnS and $Cu_2S$ were put into each vaporizing source and each material was irradiated with electron beams under a vacuum of the order of $10^{-6}$ Torr to vaporize the material, thereby forming a film. The temperature of the substrate in this case was set to 200° C.

b) After the above film was formed, the substrate was heat-treated at 800° C. for one hour in a nitrogen atmosphere. The obtained film was analyzed by the X-ray diffraction method and by SEM observation of the section to examine the structure of the film. As a result, the film was a mixture of fine ZnS particles and $Cu_2S$ segregated among these particles. In this case, the ZnS particles are n-type semiconductor particles and $Cu_2S$ segregated among these particles is a p-type semiconductor.

(3) Next, a transparent electrode 2 was formed using a 1 mm square pattern by the sputtering method on the phosphor layer 3.

A light-emitting device 10a of another example was obtained by the above process. This light-emitting device 10a was evaluated by connecting a power source 5 between the electrode 4 and the transparent electrode 2. Although, here, a d.c. power source was used as the power source 5, an a.c. power source may be used. When a voltage is applied between the electrodes 2 and 4, the emission of light was observed at an applied voltage of about 10 V and a luminosity of about 1000 $cd/m^2$ was obtained at about 30 V.

<Effect>

The light-emitting device according to this embodiment ensured that higher luminosity was obtained at a low applied voltage than in the case of the conventional light-emitting device. Also, the light-emitting device according to this embodiment ensured that higher luminosity and a longer half-value period than the conventional electroluminescence device.

Comparative Example

As a comparative example, a light-emitting device was produced using the EB vapor deposition method according to the same production method as in Example 1.

(1) A substrate produced by forming a transparent conductive film on a glass substrate was prepared. In this case, the glass substrate corresponds to the substrate and the transparent conductive film corresponds to the transparent electrode.

(2) A phosphor layer was formed using the EB vapor deposition method on the transparent conductive film of the glass substrate. As the EB vapor deposition apparatus, an electron beam (EB) vapor deposition machine having a ternary vaporizing source was used in the same manner as in Example 1. Powders of ZnS and indium tin oxide were put into each vaporizing source and each material was irradiated with electron beams under a vacuum of the order of $10^{-6}$ Torr to vaporize the material, thereby forming a film on the transparent conductive film 2. When the film was formed, various conditions such as the introduction of oxygen and a variation in oxygen pressure were changed to produce a film. Also, the temperature of the substrate was set to 200° C. The obtained film was analyzed by the X-ray diffraction method and by SEM observation of the section to examine the structure of the film. As a result, the film was a mixture of fine ZnS particles and indium tin oxide (FIG. 13).

(3) Next, a Pt electrode 4 was formed using a 1 mm square pattern by the sputtering method on the phosphor layer.

A light-emitting device of the comparative example was obtained by the above process. This light-emitting device of the comparative example was evaluated by applying a voltage between both electrodes. As a result, no light emission was confirmed even by applying a d.c. voltage of 20 V and when the voltage was further increased, the light-emitting device was broken.

When the above light-emitting device obtained by Example 1 of the present invention was compared with the light-emitting device of the comparative example, the light-emitting device of the present invention emitted light more stably than the light-emitting device of the comparative example. Specifically, in the case of the light-emitting device of Example 1 of the present invention, the emission luminosity of about 1000 $cd/m^2$ was obtained at a d.c. voltage of about 30 V, whereas, in the case of the light-emitting device of the comparative example, no emission of light could be confirmed when a d.c. voltage was applied, showing that the light-emitting device of Example 1 was apparently superior to that of the comparative example.

Second Embodiment

Schematic Structure of Display

Figure 6:
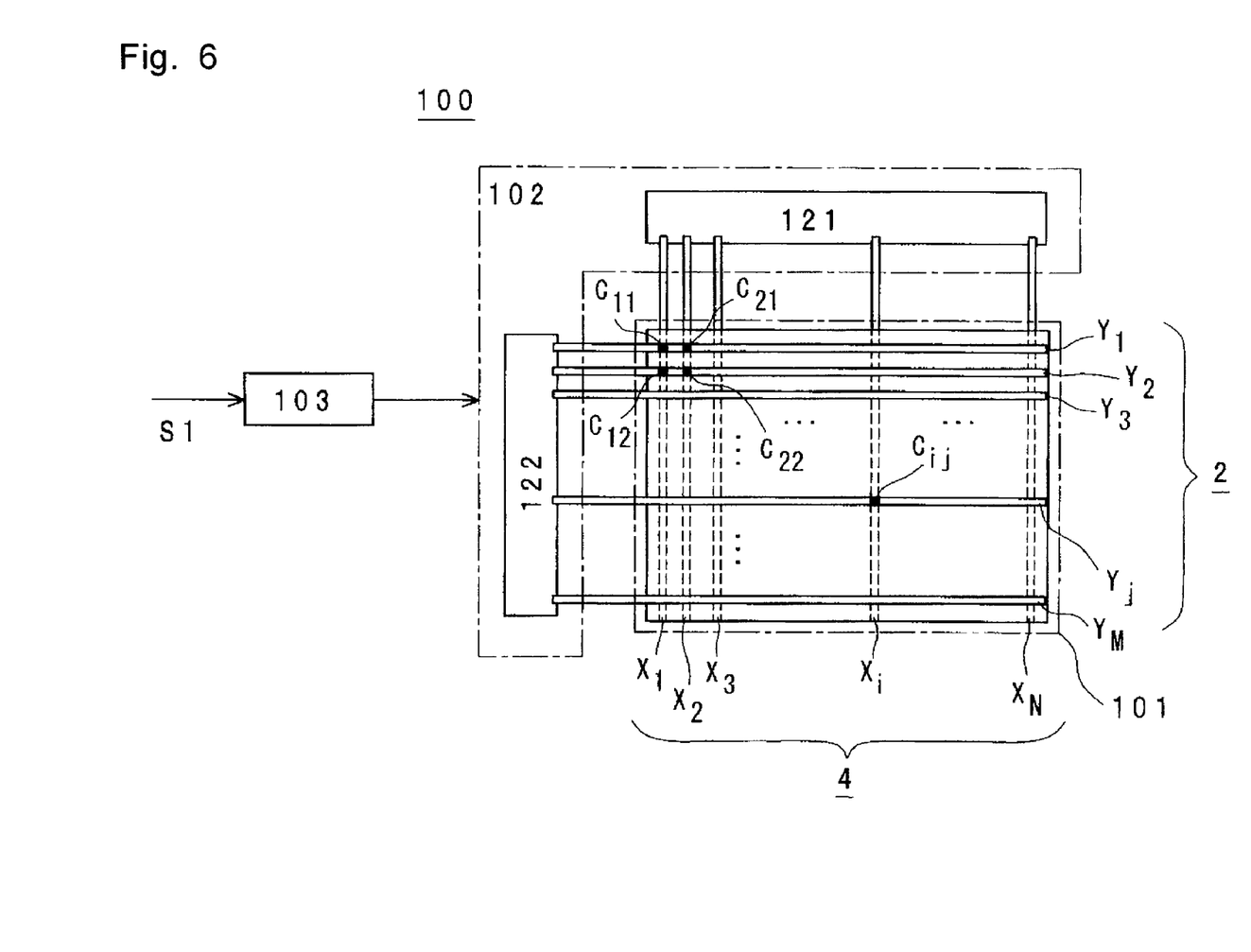
FIG. 6 is a block diagram showing the structure of a passive matrix type display according to a second embodiment of the present invention.
Figure 9:
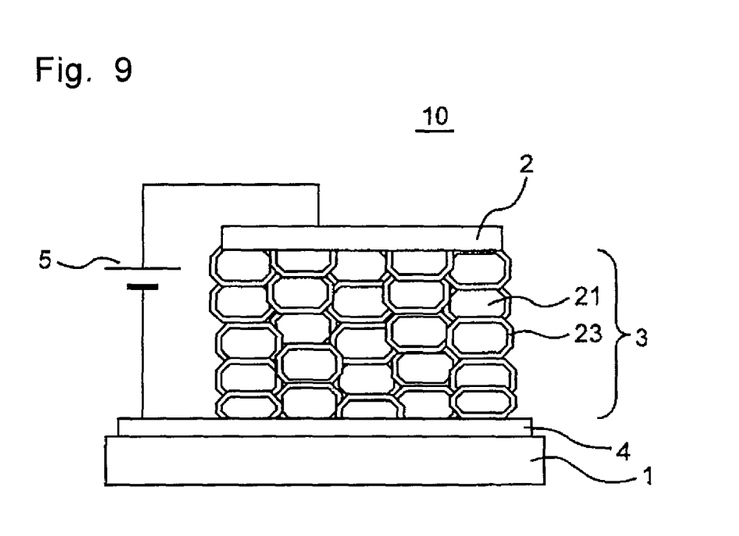
FIG. 9 is a schematic view showing the structure of each pixel shown in FIG. 8 when the pixel is assumed to be one EL device.

FIG. 6 is a block diagram showing the schematic structure of a passive matrix type display 100 according to the first embodiment of the present invention. This passive matrix type display 100 is constituted of a display section 101, a drive section 102 which selectively drives the above EL device and a control section 103 which controls the drive section 102 and supplies power. In this embodiment, for example, a d.c power source as shown in FIG. 9 is used as the supply power source. Also, the drive section 102 is provided with a data electrode drive circuit 121 which drives a data electrode $X_i$ and a scanning electrode drive circuit 122 which drives a scanning electrode $Y_j$.

Figure 7:
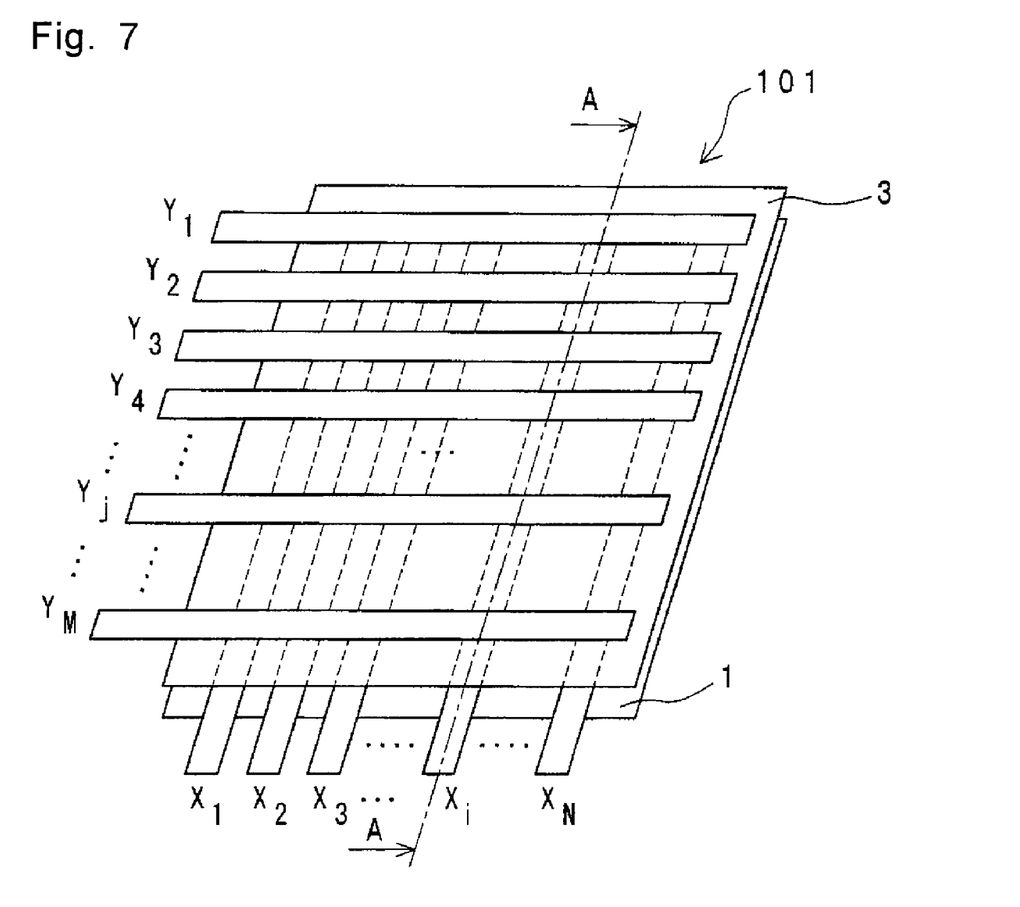
FIG. 7 is a perspective view showing the structure of the display section of the display of FIG. 6.

FIG. 7 is a perspective view showing the structure of the display section 101. The display section 101 is provided with a substrate 1, plural data electrodes $X_1, X_2, X_3 \ldots X_i \ldots X_N$ forming an array extending in parallel along a first direction (the direction of the row in FIG. 6 and FIG. 7), a phosphor layer 3 and plural scanning electrodes $Y_1, Y_2, Y_3 \ldots Y_i \ldots Y_M$ forming an array extending in parallel along a second direction (the direction of the line in FIG. 6 and FIG. 7) perpendicular to the first direction.

The part at which a pair of data electrode $X_i$ and scanning electrode $Y_j$ intersect with each other is called a pixel $C_{ij}$. This display section 101 is provided with N×M pixels $C_{ij}$ arranged two-dimensionally. Also, the coordinate of each pixel $C_{ij}$ is defined by the subscripts i and j. For example, the pixel $C_{11}$ indicates a pixel at a coordinate where the data electrode $X_1$ and the scanning electrode $Y_1$ intersect with each other, the pixel $C_{21}$ indicates a pixel at a coordinate where the data electrode $X_2$ and the scanning electrode $Y_1$ intersect with each other and the pixel $C_{12}$ indicates a pixel at a coordinate where the data electrode $X_1$ and the scanning electrode $Y_2$ intersect with each other. Therefore, the pixels $C_{11}$ and $C_{21}$ are connected to the scanning electrode $Y_1$ and the pixel $C_{12}$ is connected to the scanning electrode $Y_2$. On the other hand, the pixels $C_{11}$ and $C_{12}$ are connected to the data electrode $X_1$ and the pixel $C_{21}$ is connected to the data electrode $X_2$.

Figure 8:
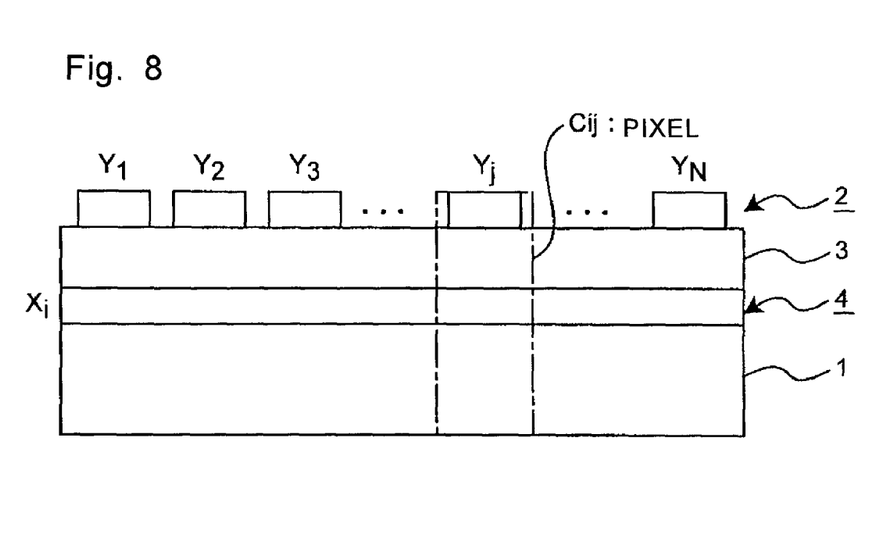
FIG. 8 is a view of the section perpendicular to a light-emitting plane along the line A-A of FIG. 7.

FIG. 8 is a view of the section perpendicular to the light-emitting plane along the line A-A of FIG. 7. As shown in FIG. 8, each pixel $C_{ij}$ is constituted of a data electrode $X_i$ (backside electrode 4), a phosphor layer 3 and a scanning electrode $Y_j$ (transparent electrode 2) which are laminated in this order on the substrate 1. Each pixel $C_{ij}$ corresponds to one EL device. Therefore, in the display section 101, it is assumed that plural EL devices are arranged two-dimensionally. In this embodiment, the phosphor layer 3 is formed as a layer continued over each pixel $C_{ij}$. However, the present invention is not limited to such a structure and may have a structure in which the phosphor layer 3 is disposed in each pixel $C_{ij}$ separately. For example, the phosphor layer 3 may be divided for every pixel $C_{ij}$. Alternatively, an EL device array may be adopted in which the EL devices except for the data electrode $X_i$ and the scanning electrode $Y_j$ are respectively separated for every pixel and each EL device is arranged two-dimensionally. In this case, it is only required to constitute an EL device in each of all pixel $C_{ij}$ where N data electrodes $X_i$ and M scanning electrodes $Y_j$ intersect with each other.

FIG. 9 is a typical schematic view of one pixel $C_{ij}$ in FIG. 8 when this one pixel is assumed to be one EL device 10. This EL device 10 has a structure in which a backside electrode 4, a phosphor layer 3 and a transparent electrode 2 are laminated in this order on a substrate 1. A voltage is applied to the phosphor layer 3 by a d.c. power source 5 to emit light from the phosphor layer 3. In this example, the backside electrode 4 corresponds to the data electrode $X_i$ and the transparent electrode 2 corresponds to the scanning electrode $Y_j$. The correspondence of the backside electrode 4 and the transparent electrode 2 to the data electrode $X_i$ and the scanning electrode $Y_j$ is not limited to the above case and may be inverted. Further, the order of lamination may also be inverted.

Figure 10:
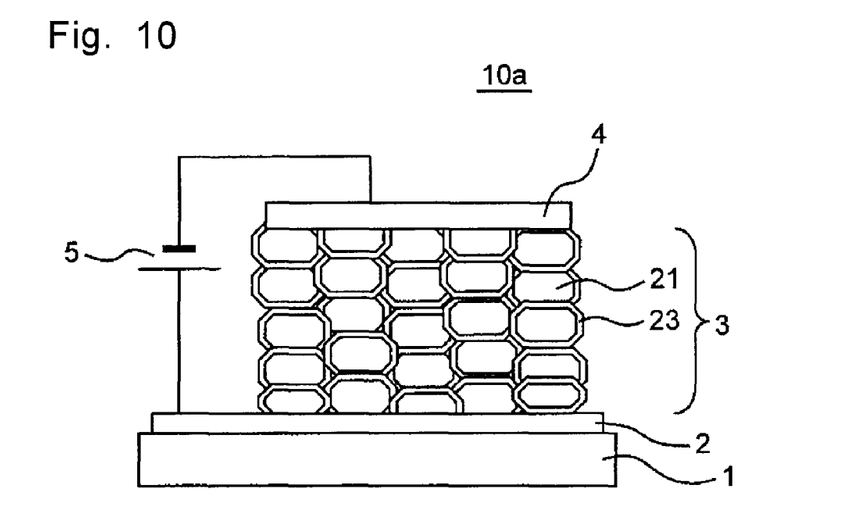
FIG. 10 is a schematic view showing the structure of an EL device of another example of FIG. 9.
Figure 11:
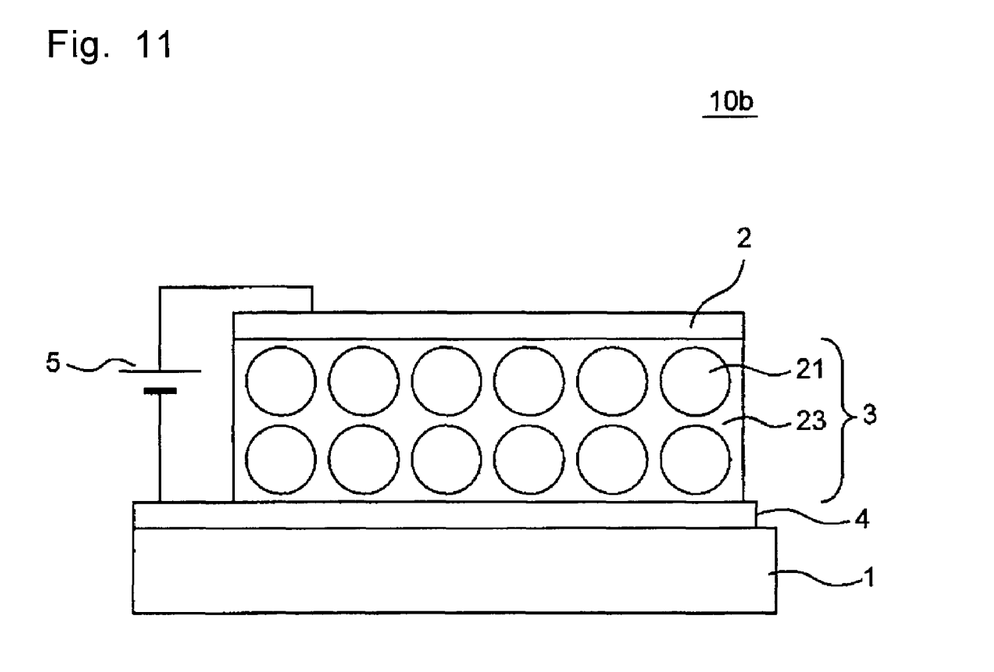
FIG. 11 is a schematic view showing another example of the structure of each pixel $C_{ij}$ shown in FIG. 8 when the pixel is assumed to be one EL device.

This EL device 10 is characterized by the feature that the phosphor layer 3 is constituted of an aggregate of n-type semiconductor particles 21 as shown in FIG. 9 wherein a p-type semiconductor 23 is segregated among these particles. Here, the following explanations are to be offered as to the case where the backside electrode 4 is disposed on the substrate 1 as shown in FIG. 9. The present invention is not limited to this case and may have, for example, a structure in which the transparent electrode 2 is disposed on the substrate 1 and the phosphor layer 3 and the backside electrode 4 are laminated in this order on the transparent electrode 2 as shown by the EL device 10a of another example of FIG. 10. Alternatively, an EL device 10b of another example as shown in FIG. 11 is characterized by the feature that the phosphor layer 3 is constituted by dispersing n-type semiconductor particles 21 in a medium of a p-type semiconductor 23. The formation of many boundaries between n-type semiconductor particles and a p-type semiconductor in this manner improves the hole injection ability, enabling electron and holes to be recombined to emit light efficiently, with the result that a light-emitting device can be attained which emits light with high luminosity at low voltages. Moreover, the structure in which n-type semiconductor particles are electrically connected to an electrode interposing a p-type semiconductor therebetween can improve the luminous efficiency of the device, to thereby obtain a display which can emit light at low voltages and emits light with high luminosity.

A color display can be obtained by separately forming the phosphor layers 3 using fluorescent materials of RGB colors respectively. Alternatively, light-emitting units of transparent electrode/phosphor layer/backside electrode of each of RGB colors may be laminated. Also, in the case of a color display of another example, a display device provided with a single color phosphor layer or a two-color phosphor layer is formed and then a color filter and/or a color conversion filter is used, thereby making it possible to display each color of RGB.

Figure 12:
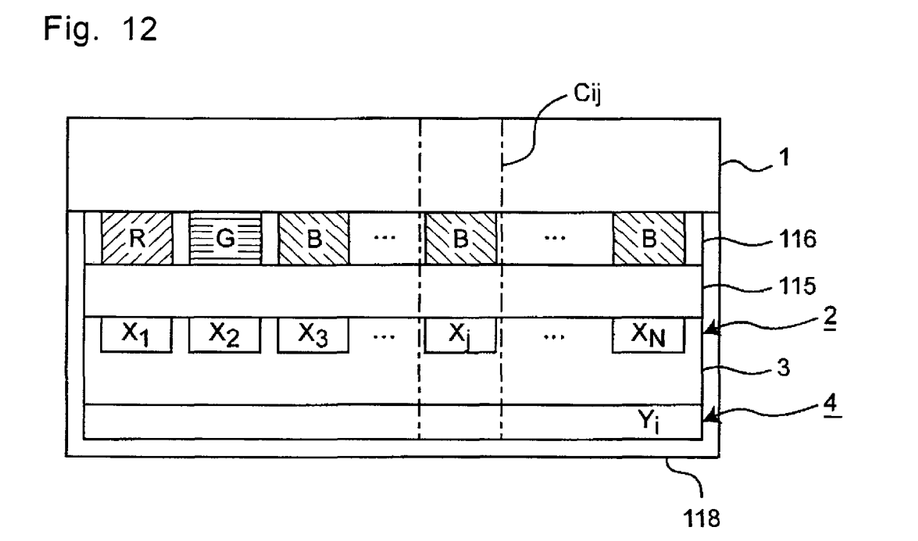
FIG. 12 is a schematic view showing the structure of a color display of another example of the present invention.

FIG. 12 is an example of the display section of a color display. In this example, a color conversion layer 115 and a color filter 116 are provided between the substrate 1 and the plural data electrodes. The color conversion layer 115 is disposed between the phosphor layer 3 and the color filter 116 and converts the light emitted from the phosphor layer 3 into white light. The color filter 116 is provided with one of a red color filter R, a green color filter G and a blue color filter B for each data electrode. The white light emitted from the color conversion layer 115 is made to pass through the red filter R, the green filter G and the blue filter B where red light, green light and blue light are transmitted respectively to display each color.

The color display of the present invention is not limited to the above structures and may be optionally modified into various structures including a structure provided with plural phosphor layers 3, a structure provided with plural thin dielectric layers between the electrode and the phosphor layer for the purpose of limiting the current, a structure in which the electrodes are driven by an a.c. power source, a structure in which both the scanning electrode and the data electrode are made of transparent electrodes, a structure in which either one of the electrodes is changed to a black color electrode, a structure further provided with a structure for sealing all or part of the display 100 or a structure further provided with a structure converting the color emitted from the phosphor layer 3 into other colors in the front side in the direction of extraction of the light.

<Control Method of Display>

When a voltage equal to or above the emission initiation voltage is applied to the phosphor layer 3 in the pixel $C_{ij}$ selected by the scanning electrode 2 and the data electrode 4, a current flows inside of the phosphor layer 3 to emit light.

(a) First, an image data S1 is input into a control means 103.

(b) Next, the control means 103 drives a data electrode drive circuit 121 and a scanning electrode drive circuit 122 based on the information as to whether or not respective pixels are made to emit light.

(c) The scanning electrode drive circuit 122 applies a voltage to a scanning electrode corresponding to a pixel $C_{ij}$ to be emitted.

(d) The data electrode drive circuit 121 applies a voltage to a data electrode corresponding to a pixel $C_{ij}$ to be emitted.

(e) When a voltage equal to or above the emission initiation voltage is applied to the phosphor layer 3 in a pixel $C_{ij}$ where the scanning electrode and the data electrode to which the voltages have been applied intersect with each other, a current flows inside of the phosphor layer 3 to emit light.

As the method in which an arbitrary pixel among plural pixels is made to emit light, a system in which voltages are applied to selected one scanning electrode and selected one data electrode to make each pixel emit light or a line sequential scanning system in which voltages are applied to selected one scanning electrode and selected one or plural data electrodes to make each scanning electrode emit light may be applied.

In the following, an embodiment of a method of producing a display according to the first embodiment will be explained. In this example, the data electrode $X_i$ is the backside electrode 4 and the scanning electrode $Y_j$ is the transparent electrode 2 like the case of the device shown in FIG. 8. As to the above phosphor layer made of other materials, the same production method may be utilized.

(1) Corning 1737 is prepared as the substrate 1.

(2) A data electrode $X_i$ (backside electrode 4) is formed on the substrate 1. For example, Al is used to form patterns almost parallel to each other at specified intervals by the photolithographic method. The thickness of the film is designed to be 200 nm.

(3) A phosphor layer 3 is formed on the substrate 1. Powders of ZnS and $Cu_2S$ are put into plural vaporizing sources respectively and electron beams are applied to each material under a vacuum (of the order of $10^{-6}$ Torr) to form a film as the phosphor layer 3 on the substrate 1. At this time, the substrate temperature is set to 200° C. to co-deposit ZnS and $Cu_2S$.

(4) After the phosphor layer 3 is formed, it is baked at 700° C. for about one hour in a sulfur atmosphere. When this film is investigated by X-ray diffraction and SEM, a polycrystalline structure of fine ZnS crystal particles and the segregated portion of $Cu_xS$ are observed. Although not clarified in detail, it is inferred that phase separation is caused between ZnS and $Cu_xS$, resulting in the formation of the above segregated structure.

(5) In succession, a scanning electrode $Y_j$ (transparent electrode 2) is formed using, for example, ITO by patterning. Data electrodes 114 are formed in almost parallel to each other at specified intervals in such a manner as to lie at almost right angles to the data electrode $X_i$. The film thickness is designed to be 200 nm.

(6) Successively, a transparent insulation layer of, for example, silicon nitride is formed as a protective layer (omitted in the drawing) on the phosphor layer 3 and the scanning electrode $Y_j$.

A display of this embodiment is obtained by the above process.

It is not necessary to operate this display in the condition of an a.c. current and a high voltage unlike the conventional EL device and a necessary and sufficient emission luminosity can be obtained under a d.c. current of about 5 to 10 V.

Also, in the case of a color display, it is only necessary to form the phosphor layers using fluorescent bodies having each of RGB colors separately. Alternatively, light-emitting units of transparent electrode/phosphor layer/backside electrode of each of RGB colors may be laminated. Also, in the case of a color display of another example, a display device provided with a single color phosphor layer or a two-color phosphor layer is formed and then a color filter and/or a color conversion filter is used, thereby making possible to display each color of RGB.

<Effect>

It is unnecessary to operate a display according to this embodiment in the condition of an a.c. current and a high voltage unlike the conventional display and a necessary and sufficient emission luminosity can be obtained under a d.c. current at a low voltage.

The light-emitting device of the present invention has a high emission luminosity and may be therefore utilized for LCD back-lights, illuminations and displays.

With the display according to the present invention, a display which can provide highly bright display can be provided even if it is operated at a low voltage. Particularly, the display according to the present invention is useful as displays used in digital cameras, car navigation systems and television sets.

The invention claimed is:

1. A light-emitting device comprising:
a first electrode;
a second electrode disposed opposite to the first electrode; and
a phosphor layer which is sandwiched between the first electrode and the second electrode, wherein:
the phosphor layer is constituted of an aggregate of n-type semiconductor particles made of ZnS, and a p-type semiconductor segregated among the n-type semiconductor particles,
at least one of the first electrode and the second electrode is constituted of zinc oxide doped with aluminum (AZO),
a ZnO film is produced at the boundary between the electrode constituted of the AZO and the phosphor layer, and the doped aluminum is diffused at the boundary.

* * * * *